(12) United States Patent
Babcock et al.

(10) Patent No.: US 11,955,530 B2
(45) Date of Patent: Apr. 9, 2024

(54) RF MOS VARACTOR

(71) Applicant: Texas Instruments Incorporated, Dallas, TX (US)

(72) Inventors: Jeff Archimedes Babcock, Sunnyvale, CA (US); Will David French, San Jose, CA (US); Dahlstrom Erik Mattias, Los Altos, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/514,532

(22) Filed: Oct. 29, 2021

(65) Prior Publication Data

US 2023/0135765 A1    May 4, 2023

(51) Int. Cl.
*H01L 29/66* (2006.01)
*H01L 29/06* (2006.01)
*H01L 29/93* (2006.01)
*H01L 29/94* (2006.01)

(52) U.S. Cl.
CPC .... *H01L 29/66189* (2013.01); *H01L 29/0653* (2013.01); *H01L 29/93* (2013.01); *H01L 29/94* (2013.01)

(58) Field of Classification Search
CPC ............... H01L 29/66174; H01L 29/94; H01L 29/66189; H01L 29/0653; H01L 29/93; H01L 29/66681; H01L 2924/12034; H01L 27/0808

See application file for complete search history.

(56) References Cited

U.S. PATENT DOCUMENTS

| 2013/0043513 | A1* | 2/2013 | Huang | H01L 29/7816 257/E21.546 |
| 2014/0070315 | A1* | 3/2014 | Levy | H01L 21/266 438/286 |
| 2018/0151410 | A1* | 5/2018 | Usami | H01L 21/823892 |
| 2018/0166545 | A1* | 6/2018 | Wang | H01L 29/4232 |
| 2021/0193526 | A1* | 6/2021 | Pandey | H01L 21/8249 |
| 2021/0242306 | A1* | 8/2021 | Mishra | H01L 21/266 |
| 2021/0313316 | A1* | 10/2021 | Huang | H01L 21/823481 |

OTHER PUBLICATIONS

D. Dunwell and B. Frank, "Accumulation-Mode MOS Varactors for RF CMOS Low-Noise Amplifiers," 2007 Topical Meeting on Silicon Monolithic Integrated Circuits in RF Systems, 2007, pp. 145-148, doi: 10.1109/SMIC.2007.322802.

* cited by examiner

*Primary Examiner* — Wasiul Haider
(74) *Attorney, Agent, or Firm* — Andrew R. Ralston; Frank D. Cimino

(57) ABSTRACT

An integrated circuit includes a substrate having a first conductivity type. A well formed at an upper surface has a second, opposite conductivity type and a first dopant concentration. First and second STI structures are formed and a polysilicon gate structure is formed between the first and second STI structures. The polysilicon gate structure extends over a first side of the first STI structure and over a first side of the second STI structure. A first doped region is formed within the well at the upper surface and on a second side of the first STI structure and a second doped region is formed within the well at the upper surface and on a second side of the second STI structure. The first and second doped regions each have the second conductivity type and a second dopant concentration that is greater than the first dopant concentration.

22 Claims, 13 Drawing Sheets

RF MOS VARACTOR

BACKGROUND

A metal-oxide-semiconductor (MOS) varactor, also known as a variable capacitor, can be fabricated using the structure analogous to that of a MOS field effect transistor (FET), wherein what would otherwise be source and drain regions operate as bias terminals to bias a well region with respect to a gate electrode. When the voltage applied between the terminals and the gate is varied, the charge layer beneath the gate oxide will vary either by charge carrier depletion or accumulation. This creates a voltage-dependent capacitance between the heavily doped polysilicon gate electrode and the bias terminals that can be tuned by varying the DC voltage between the gate electrode and the bias terminals.

SUMMARY

Disclosed examples provide a method of fabricating a MOS varactor in which both sides of a polysilicon gate structure terminate over shallow trench isolation (STI) structures, providing physical separation between a channel region and contacts to doped regions that provide a conductive connection to the channel region. A buried layer may be provided below the well structure to change the resistance between the channel region and the doped regions. The disclosed method may use up to three mask layers not previously utilized in MOS varactor fabrication. One implementation will be discussed using a BiCMOS technology, which generally uses these mask layers in other regions of the chip, so these "new" mask layers may be incorporated into many new designs without additional costs. The three masks include a composite mask, a well mask, and a buried layer (BL) mask. The composite mask is used to add the STI structures underneath the ends of gate structures. The well mask and the BL mask may block a respective implant over portions of a planned channel region and can be used to adjust the dopant levels in the channel region, e.g., to make depletion in the channel region more three dimensional and to optimize performance. The regions blocked respectively by the well mask and the BL mask can be adjusted in size for different performance optimization, depending on the fabrication technology and the particular application, and provides designers with new options.

In one aspect, an example of an integrated circuit is disclosed. The integrated circuit includes a substrate having a first conductivity type, the substrate having an upper surface; a well formed at the upper surface, the well having a second conductivity type that is opposite the first conductivity type, the well having a first dopant concentration; a first shallow trench isolation (STI) structure formed at the upper surface and within the well; a second STI structure formed at the upper surface and within the well; a first polysilicon gate structure formed over the upper surface between the first STI structure and the second STI structure, a first portion of the first polysilicon gate structure extending over a first side of the first STI structure and a second portion of the first polysilicon gate structure extending over a first side of the second STI structure; a first doped region formed within the well at the upper surface and on a second side of the first STI structure; and a second doped region formed within the well at the upper surface and on a second side of the second STI structure, the first and second doped regions each having the second conductivity type and a second dopant concentration that is greater than the first dopant concentration.

In another aspect, an example of a method of fabricating an integrated circuit is disclosed. The method includes forming STI structures at a first surface of a substrate, the substrate having a first conductivity type, the STI structures including a first STI structure and a second STI structure; forming a well at the first surface of the substrate, the well having a well surface and surrounding the STI structures, the well having a second, opposite conductivity type and a first dopant concentration; forming a first polysilicon gate structure over the well surface, a first portion of the first polysilicon gate structure extending over a first side of the first STI structure and a second portion of the polysilicon gate structure extending over a first side of the second STI structure; and forming bias regions having the second conductivity type located at the first surface and within the well, the bias regions having a second dopant concentration that is greater than the first dopant concentration, the bias regions including a first bias region and a second bias region, the first bias region on a second, opposite side of the first STI structure and the second bias region on a second, opposite side of the second STI structure.

BRIEF DESCRIPTION OF THE DRAWINGS

Examples of the present disclosure are illustrated by way of example, and not by way of limitation, in the figures of the accompanying drawings in which like references indicate similar elements. It should be noted that different references to "an" or "one" example in this disclosure are not necessarily to the same example, and such references may mean at least one. Further, when a particular feature, structure, or characteristic is described in connection with an example, it is submitted that it is within the knowledge of one skilled in the art to effect such feature, structure, or characteristic in connection with other examples whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more example of the present disclosure. Various advantages and features of the disclosure will be understood from the following Detailed Description taken in connection with the appended claims and with reference to the attached drawing figures in which:

DETAILED DESCRIPTION

Specific examples will now be described in detail with reference to the accompanying figures. In the following detailed description of examples, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Figure 5A:
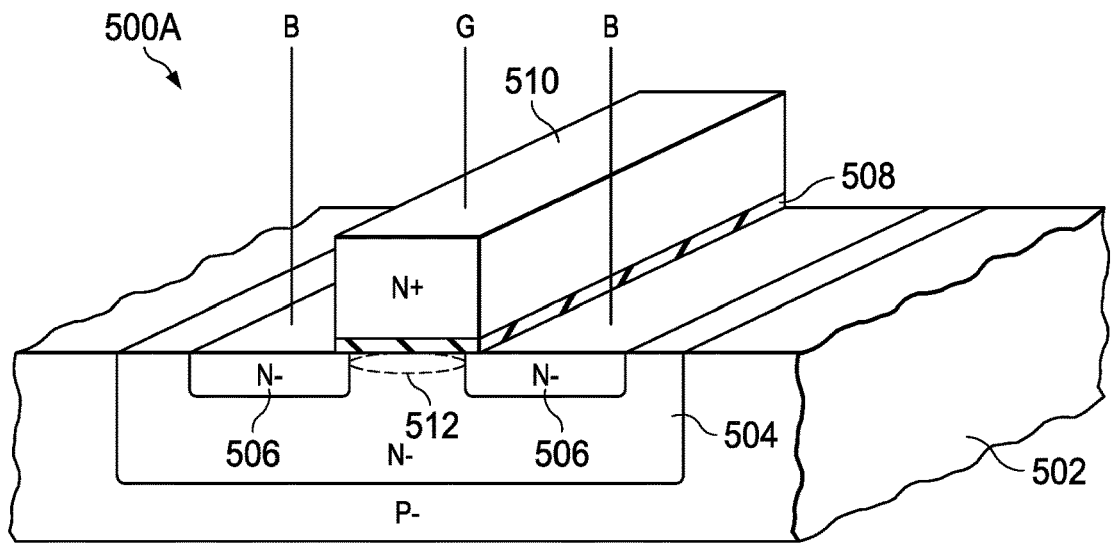
FIG. 5A depicts a perspective view of a baseline MOS varactor.
Figure 5B:
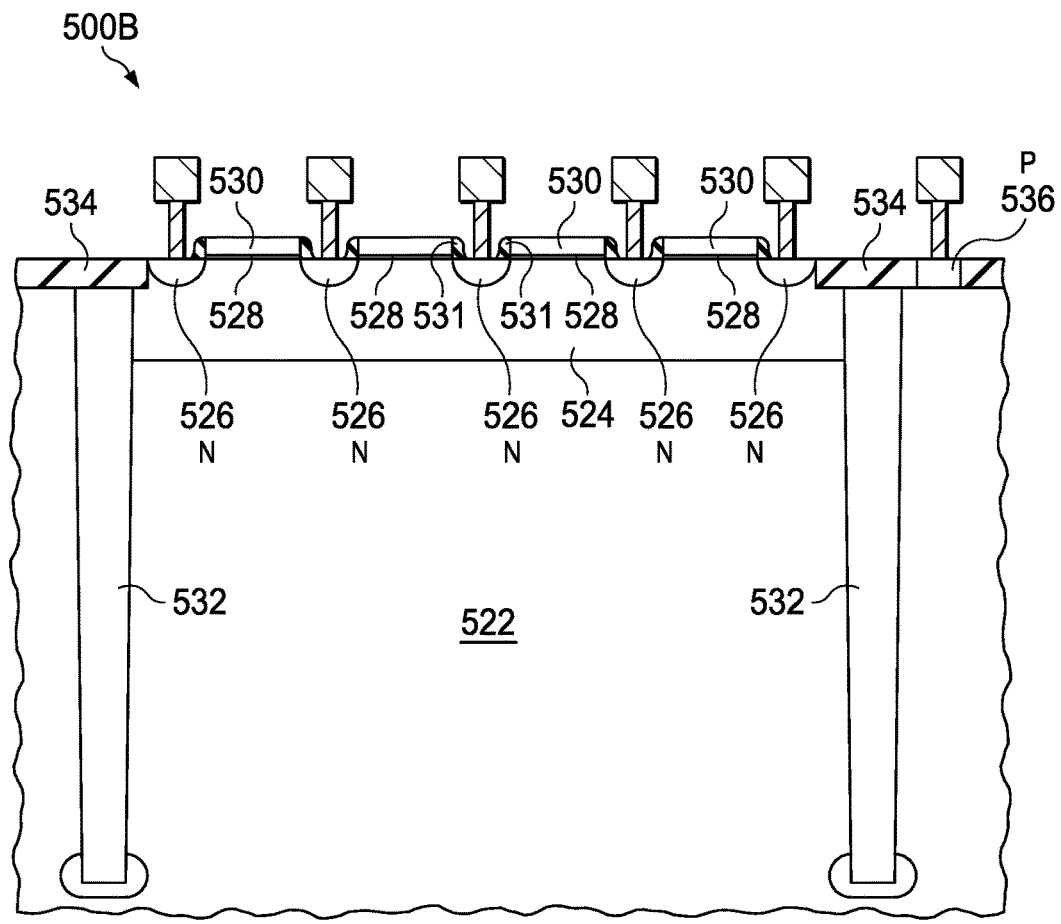
FIG. 5B depicts a cross-sectional view of a baseline MOS varactor containing multiple gate fingers.

FIGS. 5A and 5B depict views of two prior art N-type MOS (NMOS) varactors. FIG. 5A depicts a perspective view of a baseline MOS varactor 500A that is formed similar to the design of an NMOS transistor. In this implementation, the baseline MOS varactor 500A includes a P-type substrate 502, an N-type well 504 (also referred to as an NWell), and two N-type bias terminals 506 in the N-type well 504. The bias terminals 506 are formed analogous to forming source/drain regions of a MOS transistor, e.g. by heavily doped NSD implants. In the case of the varactor, these regions act as terminals to bias the N-type well 504 since they are the same conductivity type. A gate oxide 508 is formed over the channel region 512 and a polysilicon gate structure 510 is formed over the gate oxide 508. Each of the bias terminals 506 and the polysilicon gate structure 510 form elongated "fingers" that extend in parallel and can be replicated multiple times as part of the baseline MOS varactor 500A. Although not explicitly shown, the bias terminals are tied together, so that when a DC voltage is applied between the common bias terminal and the gate terminal, the charge in the channel region 512 varies and changes a capacitance between the gate electrode and the N-type well 504 that can be tuned by varying the DC voltage.

FIG. 5B depicts a cross-sectional view of a prior art MOS varactor 500B in which multiple fingers are implemented and extend in parallel when embodied in silicon. The prior art MOS varactor 500B also includes P-type substrate 522, an N-type well 524, and five N-type bias terminals 526 in the N-type well 504. Four polysilicon gate structures 530 are each formed over a respective gate oxide 528 and include sidewall spacers 531. Two deep trenches 532, each topped by an STI structure 534, isolate the N-type well 524 from other regions on the chip and reduce the parasitic capacitance with adjacent regions. A substrate contact 536 can be seen outside of the deep trench 532. The use of the fingers to form the prior art MOS varactor 500B is especially important when designing a varactor for use in radio frequency (RF) to increase the efficiency. If the plates become too large, resistive elements can particularly affect high frequency applications such as RF.

Figure 5C:
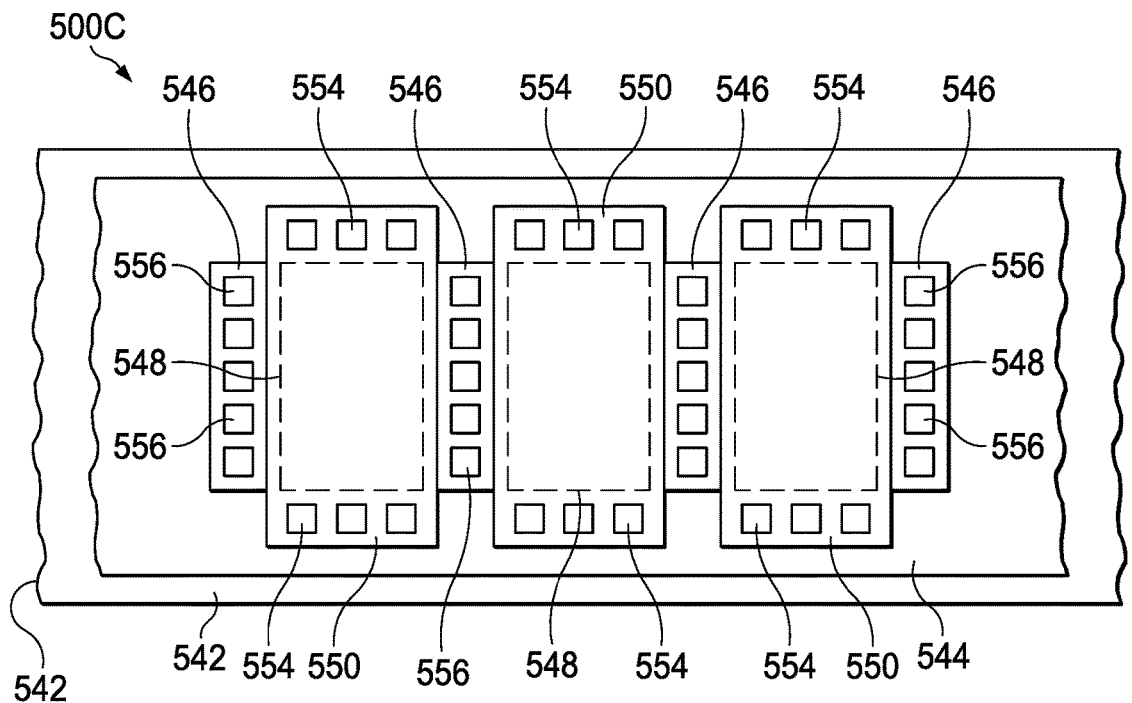
FIG. 5C depicts an overhead view of a baseline MOS varactor.

FIG. 5C is an overhead view of a prior art MOS varactor 500C such as the prior art MOS varactor 500B and is provided to illustrate where the contacts are typically placed when the device in formed in silicon. An explanation for the placement is discussed with reference to FIG. 6. A semiconductor substrate 542 includes an N-type well 544 and bias terminals 546. A portion of the N-type well 544 forms the channel regions 548, which are outlined by dotted lines and lie under respective polysilicon gates 550 and adjacent the respective bias terminals 546. A series of gate contacts 554 can be placed across the length of the polysilicon gate 550, e.g., at each end, while the bias terminal contacts 556 are placed along the width of the bias terminals 546. The gate contacts 554 are generally not placed over the channel region 548 to avoid causing gate oxide reliability problems; the gate contacts 554 may be placed over STI lying just outside of the channel regions 548.

Figure 6:
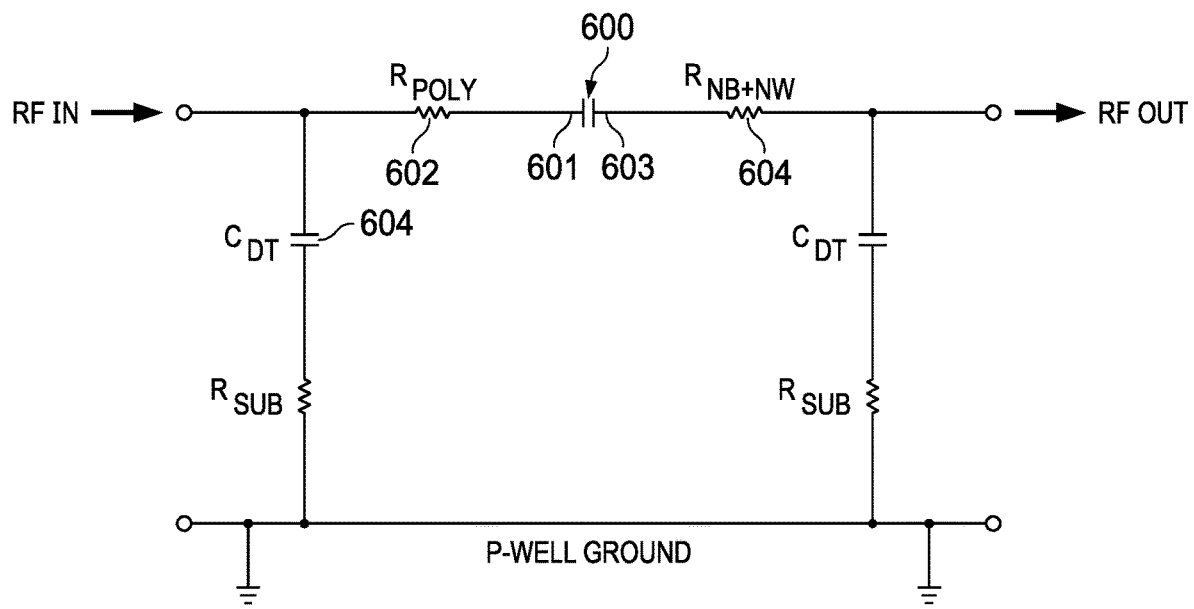
FIG. 6 depicts a circuit modelling the parasitic elements affecting a MOS varactor.

FIG. 6 graphically depicts the capacitances and resistances in a varactor lumped-element model of a varactor, such as the prior art MOS varactor 500A (FIG. 5A) or the prior art MOS varactor 500B (FIG. 5B), as a circuit having an RF signal input to an upper plate 601 of a capacitor 600 and an RF signal output from a lower plate 603 of the capacitor 600. The upper plate 601 may be formed by the gate, while the lower plate 603 may be formed by the NWell. Each of the other symbols shown represents a parasitic resistance or parasitic capacitance; collectively these parasitic elements prevent the varactor from acting as an ideal capacitor. Resistance in the polysilicon gate is represented by resistor $R_{POLY}$ 602 and resistance in the NWell and bias terminals is represented by resistor $R_{NB+NW}$ 604. The gate, in addition to the bias terminals and the N-type well that form the lower plate, experience both parasitic capacitance with the substrate and the contact to the substrate, represented by capacitors $C_{DT}$, and resistance, represented by resistors $R_{SUB}$.

A good varactor is expected to have a low on-resistance, which comes both from the polysilicon gate, which forms the upper plate, and from the lower plate. The polysilicon gate structure typically has a layer of silicide, giving the overall gate structure a sheet resistance of about 8 ohms per square, while NWell sheet resistance is typically much greater, e.g., 500-1000 ohms per square. To compensate for this disparity in resistance, a typical varactor layout contacts the top plate from the shorter end of the polysilicon gate structure, while the contacts for the NWell are placed along the longer structure of the bias terminals 546. A good varactor will also have a high tuning ratio and a high Q factor, both of which are affected by the parasitic capacitances that exist, e.g., between the polysilicon gate and the heavily doped N+ contacts for the bias terminals that typically extend under the gate.

In the prior art, all of the resistances and capacitances shown in FIG. 6 occur near the surface of the varactor. Although there are parameters for the arrangement and the doping of the varactor that can be adjusted to achieve a desired tuning ratio and/or Q factor, there is a large parasitic fringing capacitance near the edge of each gate that is not very susceptible to adjustment because of the heavily doped bias terminal that is partially under the gate. This parasitic capacitance limits the ability to get a favorable capacitance on/off ($C_{on}/C_{off}$) tuning ratio for the varactor. If the length of the gate structure is too short, the parasitic capacitance limits the ability to tune the device; if the length of the gate structure is too large, the desired frequency performance is limited, especially in the radio frequency range.

Some such deficiencies of the prior art varactor are addressed by examples described hereinbelow. The parasitic capacitance between the gate structure and the N+ bias terminals is addressed in the present disclosure by placing the edges of the gate structure over respective dielectric isolation structures. The dielectric structures may be STI structures, although a local oxidation of silicon (LOCOS) structure can also be used. Not only does the addition of STI structures under the edges of the gate structure greatly reduce the parasitic capacitance between the gate and the substrate, but the reduced parasitic capacitance also increases the ability to implement other changes that may improve the tuning ratio and/or the Q of the varactor.

The resistance of the lower plate of the equivalent capacitor is also addressed in the present disclosure in optional examples, initially by implanting a buried layer beneath the channel region that is more heavily doped than the channel region. An NBL typically has a resistance of about 20-30 ohms per square, which is much closer to the resistance in the upper plate. Also disclosed are masks that can be used to block portions of the well implant and/or the buried layer implant; these masks may be used to provide options in shaping the doping of the channel region to make the capacitance less of a solely surface effect and more of a three-dimensional effect.

A result of these changes is that the polysilicon gate structure may now be made wider while still achieving an improved resistance in the lower plate under the polysilicon gate structure, because instead of 600 ohms per square in the lower plate, the resistance may be 25 ohms per square. The disclosed modifications may also provide the ability to change the ratio of the perimeter to area of the channel region to make the perimeter impact less strong. Capacitance from the perimeter is reduced by placing the STI structures between Well contacts (the bias terminals) and the gate, but because there is a buried layer underneath, the resistance is not significantly increased. Reduction of this capacitance may improve the ratio of $C_{on}/C_{off}$.

Figure 1:
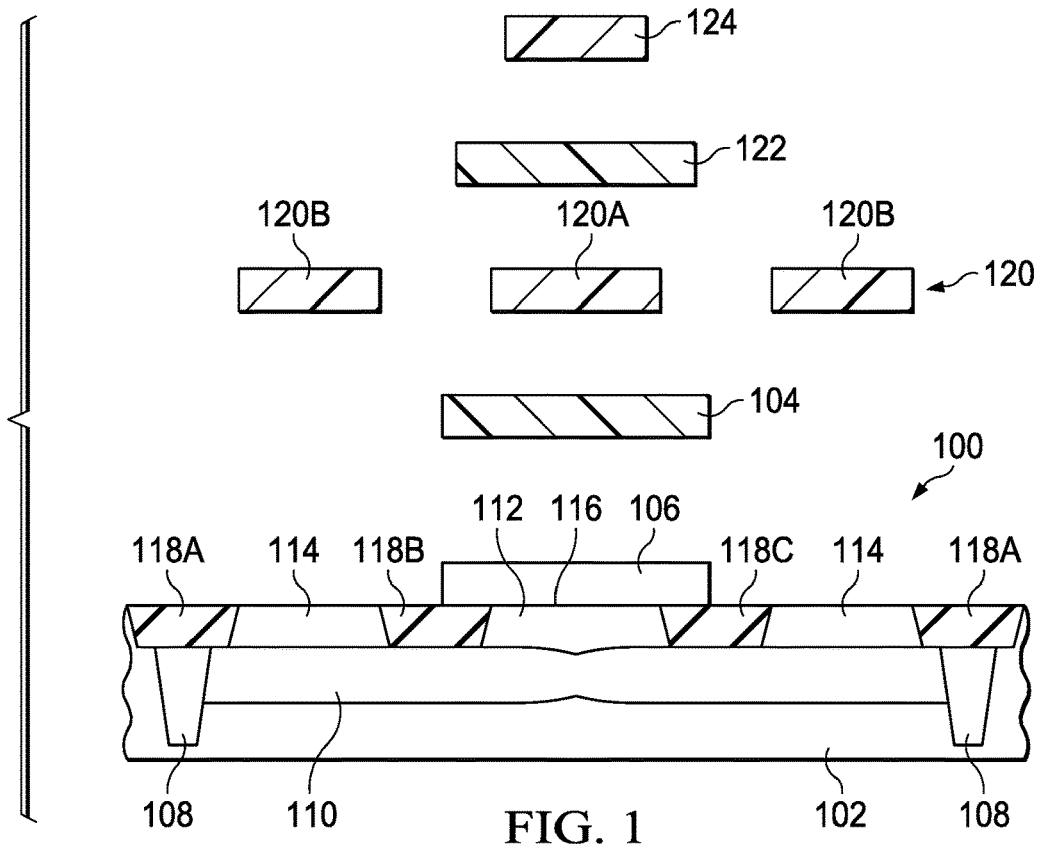
FIG. 1 depicts a number of masks that may be used for the disclosed MOS varactor according to an implementation of the disclosure.

FIG. 1 depicts three masks that may be added to the fabrication process for a MOS varactor 100 according to one implementation. In many applications, these three masks are not added to the overall fabrication process, although the use of one or more of the masks in the region of the MOS varactor 100 to provide adjustable parameters is a new feature. The dimensions of each of the respective regions masked by these additional masks may be varied as desired in order to provide electrical parameters—e.g., resistance and/or capacitance—that are best suited for a specific application.

The MOS varactor 100 may be formed on a substrate 102, which may include a conventional single crystal substrate or a silicon-on-insulator (SOI) substrate. In one implementation, the substrate 102 includes P-type silicon and the MOS varactor 100 includes N-type doping, although it is within the scope of the disclosure for the substrate to include an N-type substrate and the MOS varactor 100 to include P-type doping. A gate polysilicon mask 104, which is used to form a polysilicon gate structure 106, may be part of a baseline process flow, but is shown herein for reference. Within substrate 102, a deep trench structure 108 surrounds the MOS varactor 100 to provide isolation from the surrounding regions of the substrate 102. Although seen as two separate structures, the deep trench structure may extend on all sides of the MOS varactor 100. An optional N-type buried layer (NBL) 110 lies under an N-type well 112, while N+ sinker regions 114 act as bias terminals to couple the buried layer 110 to an upper surface 116 of the substrate. In implementations in which a buried layer 110 and/or sinker regions 114 are not used, the sinker regions 114 may also be referred to interchangeably as contact regions 114 and doped accordingly.

Three STI structures 118A-118C are shown and may be referred to collectively as the STI structures 118. While the STI structure 118A that lies over the deep trench structure 108 may be conventional or formed by a future-developed process, the STI structure 118B and the STI structure 118C, which are provided under lateral edges of the polysilicon gate structure 106, have been added to the MOS varactor 100 to improve the parasitic capacitance between the lateral edges of the polysilicon gate structure 106 and the contact regions 114. Although only the polysilicon gate structure 106 and the two STI structures 118B and 118C under the lateral edges of the polysilicon gate structure 106 are shown, there may be tens or hundreds of the polysilicon gate structures 106 in a finger-type configuration with corresponding STI structures 118 under each lateral edge.

The three added, adjustable masks include a composite mask 120, a buried layer (BL) mask 122, and a well mask 124. The composite mask is used during etching of the upper surface 116 of the substrate to form STI structures 118. As noted previously, the STI structures 118 may be conventionally formed, but the added STI structures 118B/118C are hitherto unknown. By suitable modification of the composite mask 120, the width of the STI structures 118B and 118C can be varied, as can the overlap of the polysilicon gate structure 106 with the STI structures 118B and 118C to reduce the parasitic capacitance between the polysilicon gate structure 106 and the contact regions 114.

In addition to the novel use of dielectric isolation regions under the gate edges, a buried layer is not known to have been previously used in a MOS varactor. The thickness and doping of the N-type buried layer 110 can now be used to help determine the electrical characteristics of the MOS varactor. The BL mask 122 can also be used to create a "hole" within the buried layer 110 to provide further flexibility in the electrical characteristics of the MOS varactor 100. Although some lateral diffusion is expected of the NBL dopant into the region from which the NBL implant is excluded, a lower doping density remains, creating a "hole" in the NBL that ensures that when the channel region depletes the depletion extends deeper in the channel region wherever the hole has been formed.

Finally, in the baseline process, the N-type well 112 would extend across the entire MOS varactor 100 within the region enclosed by the deep trench structure 108. However, the use of the well mask 124 provides the ability to block the NWell implant from regions in which a lower doping profile or a shaped profile are desired, creating a hole in the implanted NWell that can be designed, in common with the design of the NBL, to form a depletion region that best meets the needs of the application.

FIGS. 1A-1H depict different stages in the fabrication of a MOS varactor 100 that is fabricated in BiCMOS technology. The fabrication stages are presented in one non-limiting example using the dimensions and the masks shown in FIG. 1. Specifically, the gate polysilicon mask 104 and the polysilicon gate structure 106, which is etched using the gate polysilicon mask 104, each have a gate length of 0.94 µm. The composite mask 120 includes both a first composite mask portion 120A, which is 0.50 µm wide, and second composite mask portions 120B that are 0.42 µm wide; each of the STI structures 118 are separated from adjacent STI structures 118 by either a distance of 0.42 µm or a distance of 0.50 µm. Given these dimensions, the polysilicon gate structure 106 will overlap the adjacent STI structures by 0.22 µm. The well mask 124 blocks a width of 0.46 µm, so that in the region underlying the polysilicon gate structure 106, the dopant for the well will only be implanted into the 0.2 µm nearest each of the STI structures 118. The BL mask 122 extends 0.1 µm beyond the point at which the polysilicon gate structure 106 overlaps the STI structures 118, and in this implementation blocks 0.52 µm of the region under a channel region 134 (FIG. 1A) from receiving the buried layer implant.

Figure 1A:
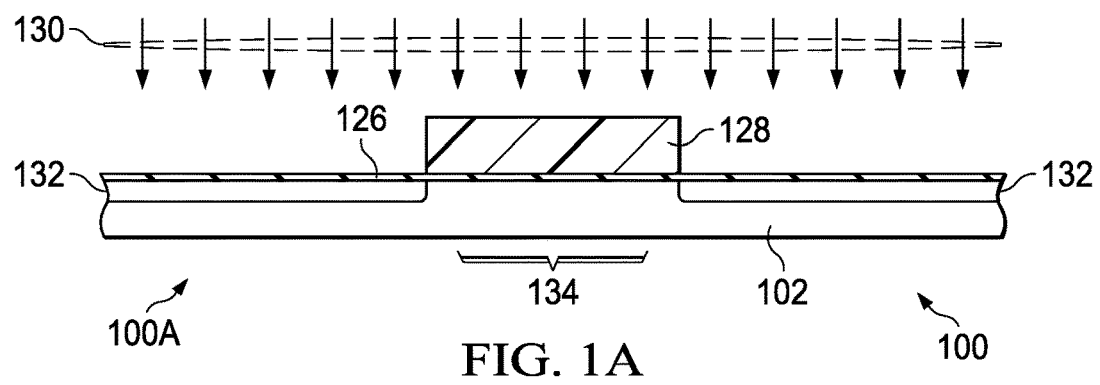
FIGS. 1A-1K depict cross-sections of various stages in the fabrication of a varactor using a BiCMOS process flow according to an implementation of the disclosure.

FIG. 1A depicts a first stage 100A of the MOS varactor 100 having the substrate 102 over which a pad oxide 126 has been formed. In one implementation, the substrate 102 may be a bulk silicon substrate having P-type conductivity on which N-type doping is used to form the MOS varactor 100, although in one implementation, the substrate 102 can have N-type conductivity on which P-type doping is used to form the MOS varactor 100. A silicon-on-insulator (SOI) may also be used for the substrate.

The fabrication process continues with forming the buried layer 110 (FIG. 1), which in one implementation is part of a conventional process for fabricating an NPN bipolar transistor, and may be performed simultaneously with forming other devices over the substrate 102. The BL mask 122 is implemented as a photoresist layer 128, which has been formed and patterned over the substrate 102. A BL implant 130 provides dopants to the substrate 102 to form a doped region 132 having a conductivity type that is opposite to the substrate 102. In the implementation shown as the first stage 100A of the MOS varactor 100, the photoresist layer 128 was patterned to block dopants in a planned channel region 134 near the center of the illustrated cross-section, so that the doped region 132 is formed as two separate doped regions. In one implementation, the BL implant 130 uses arsenic, which is implanted at about $5.0 \times 10^{15}$ cm$^2$.

Figure 1B:
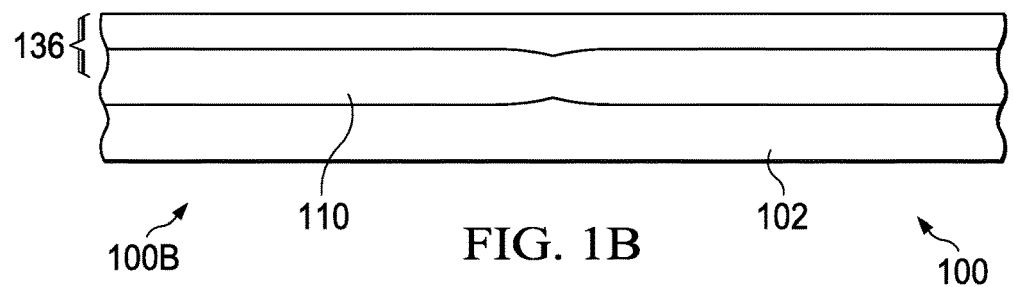

FIG. 1B depicts a second stage 100B of the MOS varactor 100 after an epitaxial layer 136 has been grown over the doped region 132 and the substrate 102. In most BiCMOS processes, the thickness and doping of the epitaxial layer 136 are generally optimized for the performance of bipolar junction transistors fabricated on the chip, although in one implementation, the thickness and doping of the epitaxial layer 136 can be optimized for the performance of the MOS varactor. In one implementation, the epitaxial layer 136 has a thickness in the range of about 8300 Å to about 9300 Å.

The epitaxial layer 136 has the same conductivity type as the substrate 102, e.g., a P-type epitaxial layer 136 for a P-type substrate 102. The doped region 132 diffuses in both vertical and lateral directions, during the epitaxial growth process and/or by a separate diffusion step, to form the buried layer 110 that has an opposite conductivity type from the substrate. It can be seen from the second stage 100B of the MOS varactor 100 that the two doped regions 132 have diffused until they overlap each other and form a continuous buried layer, although the buried layer 110 does not have the same concentration of dopants across the width of the MOS varactor 100. In one implementation, the BL mask 122 (FIG. 1A) is not used in the MOS varactor and the buried layer 110 includes a similar doping profile across the width of the buried layer 110.

Figure 1C:
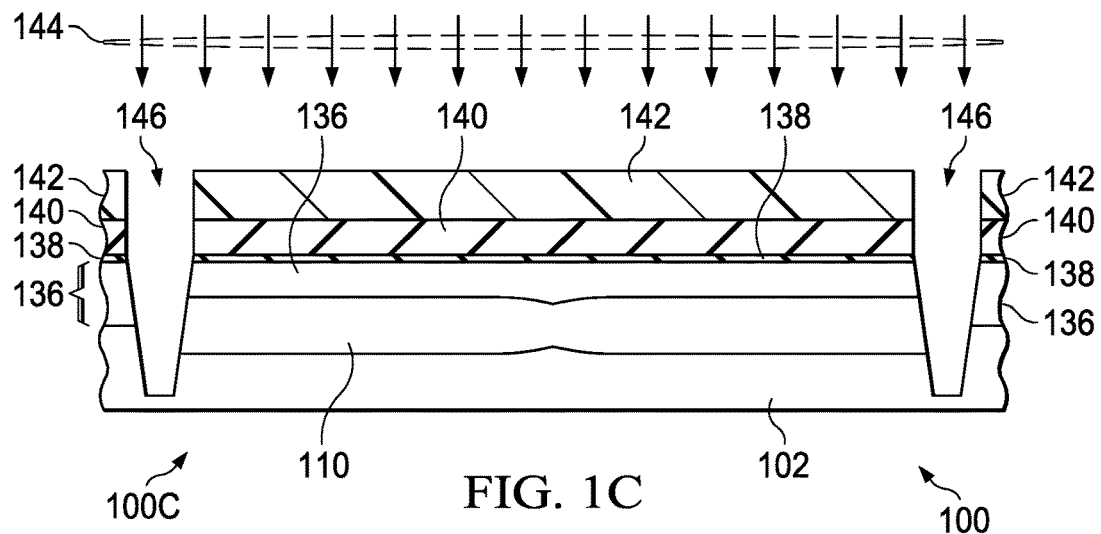

FIG. 1C depicts a third stage 100C of the in-process MOS varactor 100 in which deep trenches are being formed, which may also be part of a baseline process for fabricating an NPN bipolar transistor. A pad oxide 138 has been formed over the substrate 102 and epitaxial layer 136, then a hardmask layer 140 is deposited over the pad oxide 138 and a photoresist layer 142 is deposited over the hardmask layer 140. In one implementation, the hardmask layer 140 includes a silicon nitride layer and a silicon oxide layer (not shown separately). The thickness of the hardmask layer 140 and the photoresist layer 142 depends on the depth to which the trenches 146 are being etched. The photoresist layer 142 is patterned and the pattern is reproduced in the hardmask layer 140, followed by etching the substrate 102 to an endpoint below the buried layer 110. In the third stage 100C of the MOS varactor 100, etch process 144 is shown near the end of the process of forming trenches 146. In one implementation, the trenches 146 are etched to a depth that is in the range of about 5 µm to about 9 µm. In one implementation in which the substrate is an SOI substrate, the trenches 146 can stop on the SOI for a fully isolated varactor. In one implementation, a channel stop implant (not explicitly shown) is performed to implant a dopant into the bottom of the trenches 146 to form a heavily doped region (not explicitly shown) at the tip of the trenches 146. In one implementation, the channel stop implant includes boron at about $3 \times 10^{13}$ cm$^2$. When used, the heavily doped region has the same conductivity type as the substrate.

Figure 1D:
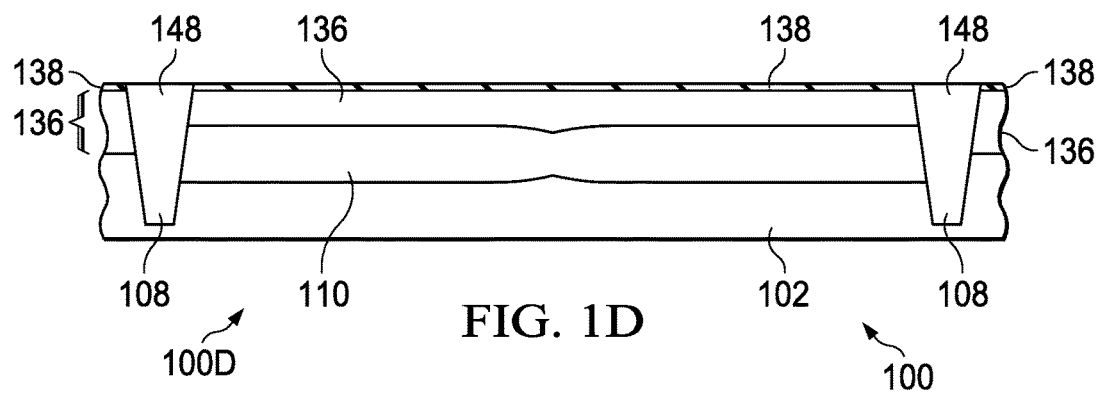

FIG. 1D depicts a fourth stage 100D of the in-process MOS varactor 100 once the etch process 144 and the implant process (if used) are complete, the photoresist layer 142 and the hardmask layer 140 are removed, and the trenches 146 are filled to form the deep trench structure 108. In one implementation, filling the trenches 146 includes growing a thin layer of silicon oxide (not explicitly shown), followed by depositing a polysilicon layer 148 to overfill the trenches 146. In one implementation, the trenches 146 may instead be filled by growing a thin oxide liner and depositing a layer of an oxide, e.g., tetraethyl orthosilicate (TEOS) to overfill the trenches 146. A planar surface is then formed using chemical-mechanical polishing (CMP) to remove the excess filling. The deep trench structure 108 can be used to reduce the parasitic capacitance at the perimeter of the MOS varactor 100.

Figure 1E:
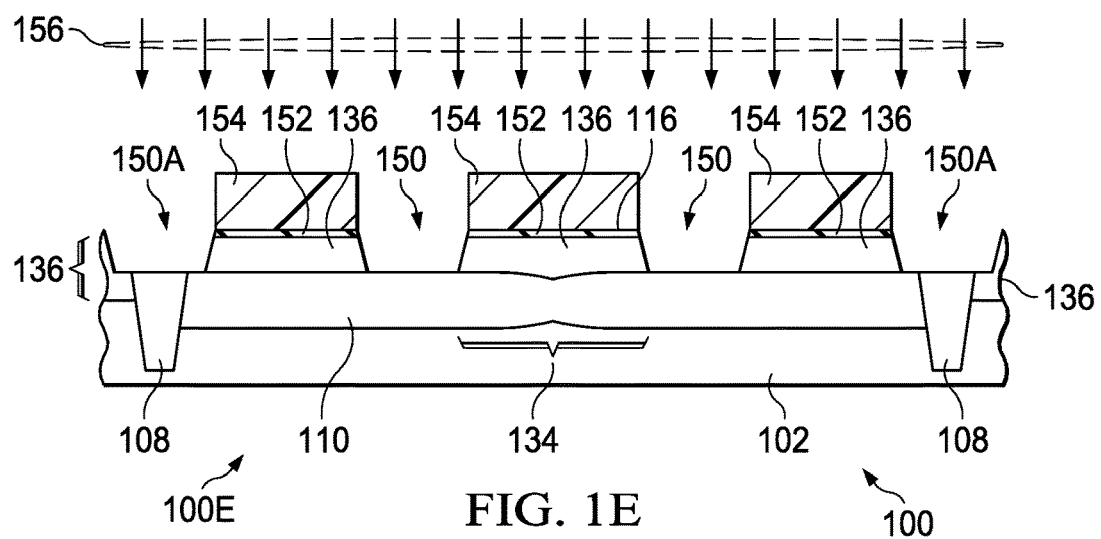

FIG. 1E depicts a fifth stage 100E of the MOS varactor 100 in which shallow trenches 150 are being formed. In the implementation shown, the shallow trench 150A is formed at the outer perimeter of the MOS varactor 100, over the deep trench structure 108; additional shallow trenches 150 are formed on either side of the planned channel region 134. A new pad oxide layer 152 is formed over the epitaxial layer 136 and a photoresist layer 154 is formed over the pad oxide layer 152. A hardmask layer (not explicitly shown) may also be formed between the pad oxide layer 152 and the photoresist layer 154, as was shown in FIG. 1C. The photoresist layer 154 and the hardmask layer, if present, are patterned. An etch process 156 removes portions of epitaxial layer 136 to form the shallow trenches 150.

Figure 1F:
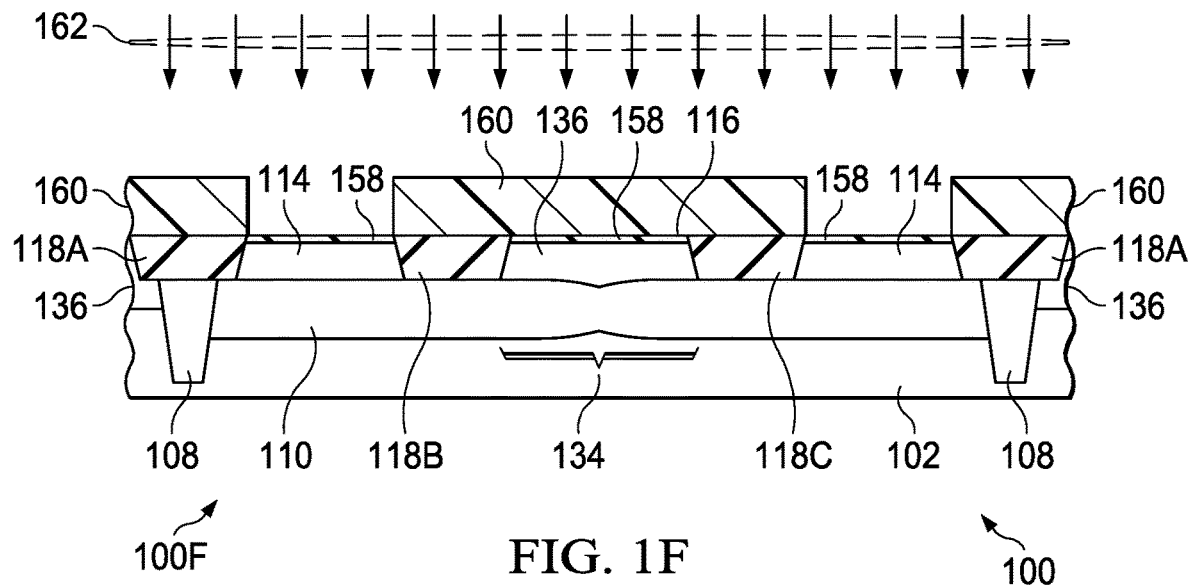

FIG. 1F depicts a sixth stage 100F of the MOS varactor 100 after the photoresist layer 154 and a hardmask layer, if present, are removed. The shallow trenches 150 have been filled and the surface has been planarized using CMP, completing formation of the STI structures 118. In one implementation, a deposited silicon dioxide is used to fill shallow trenches 150. In one implementation, a furnace field oxide is used to fill the shallow trenches 150. Both implementations use CMP to provide a planarized surface to complete the formation of the STI structures 118. Although the process is disclosed in terms of STI structures, it is expected that the process would also work with local oxidation of silicon (LOCOS) structures under the lateral edges of the gates if desired.

As also shown in the sixth stage 100F, sinker regions 114 that may serve as the terminals of the varactor 100 are being formed. A pad oxide 158 is again grown on the upper surface 116 of the substrate 102 and a photoresist 160 is deposited and patterned to expose portions of the substrate 102 between pairs of the STI structures 118 that will not have the channel region 134 between the pairs. In the sixth stage 100F as shown, exposed portions include the region between a first occurrence of the STI structure 118A and STI structure 118B and also between the STI structure 118C and a second occurrence of the STI structure 118A. A sinker implant process 162 implants a dopant having the second conductivity type into the exposed portions of the substrate 102 to form the sinker regions 114. In one implementation, the dopant is phosphorus, which is deposited at a dosage of about $3.5 \times 10^{13}$ cm$^2$ and energy of about 110 keV.

Figure 1G:
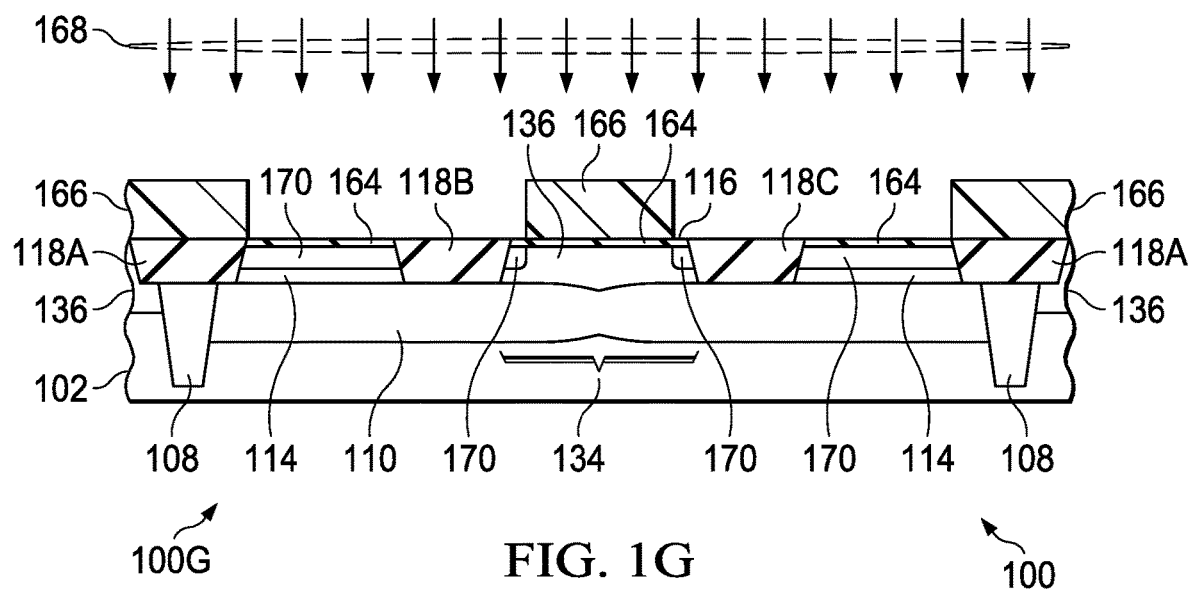

FIG. 1G depicts a seventh stage 100G of the MOS varactor 100 during formation of the N-type well 112, which may be fabricated at the same time as an Well for a PMOS transistor. A new pad oxide 164 has been grown and the well mask 124 (FIG. 1) is implemented as a photoresist 166, which has been deposited and patterned to block a portion of the channel region 134, but to expose other portions of the baseline well region; a well implant 168 is in progress. In one implementation, the well implant 168 uses phosphorus, which is implanted at a first dosage of about $1.5 \times 10^{13}$ cm$^2$ and energy of about 110 keV and at a second dosage of about $3.0 \times 10^{12}$ cm$^2$ and energy of 110 keV to form a doped region 170. In the channel region 134, diffusion of the doped region 170 will form the N-type well 112 adjacent to the surrounding STI structures 118, while the diffusion in the sinker regions 114 will add to the existing doping level. The portions of the well exposed by the photoresist 166 can be adjusted as desired to further shape doping levels within the N-type well 112. Masking of portions within the N-type well 112 may be performed either in conjunction with or instead of masking portions of the NBL.

Figure 1H:
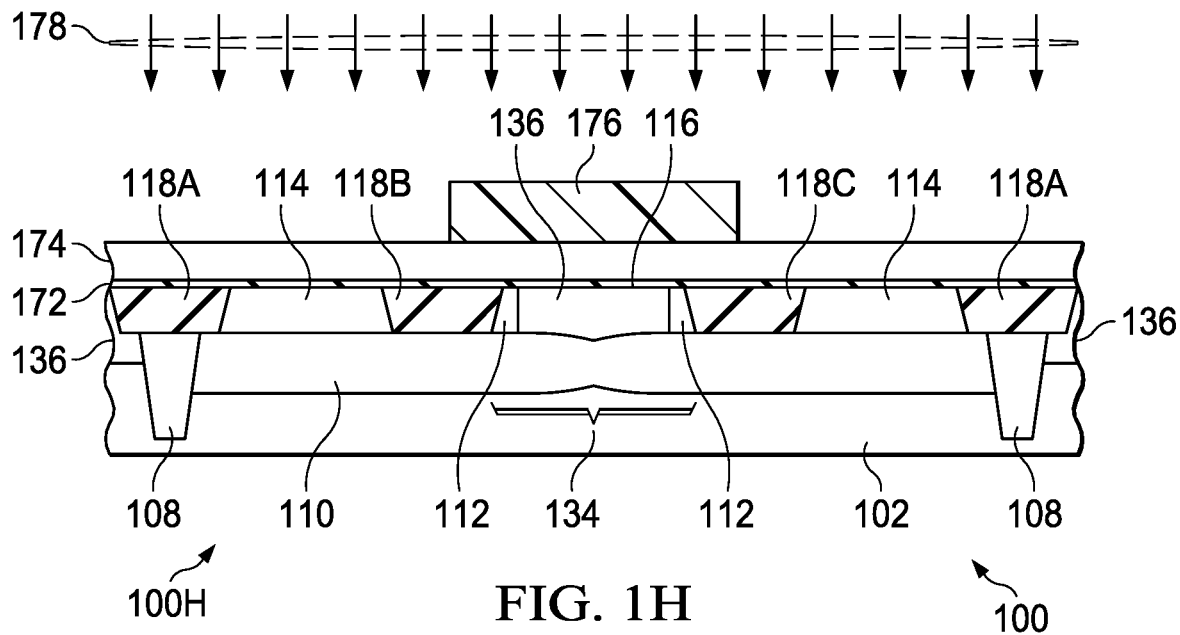

FIG. 1H depicts an eighth stage 100H of the MOS varactor 100 after the photoresist 166 has been removed and doped regions 170 have diffused to form the N-type well 112 and to add to the doping in the sinker regions 114. Additionally, a gate oxide layer 172 has been formed on the upper surface 116 of the substrate and a polysilicon layer 174 has been deposited over the gate oxide layer 172. The gate polysilicon mask 104 (FIG. 1) has been implemented as a photoresist layer 176, which has been deposited and patterned to protect the region for the gate, but to expose the remaining regions of the MOS varactor 100. An etch process 178 is performed to remove the excess portions of the polysilicon layer 174.

Figure 1I:
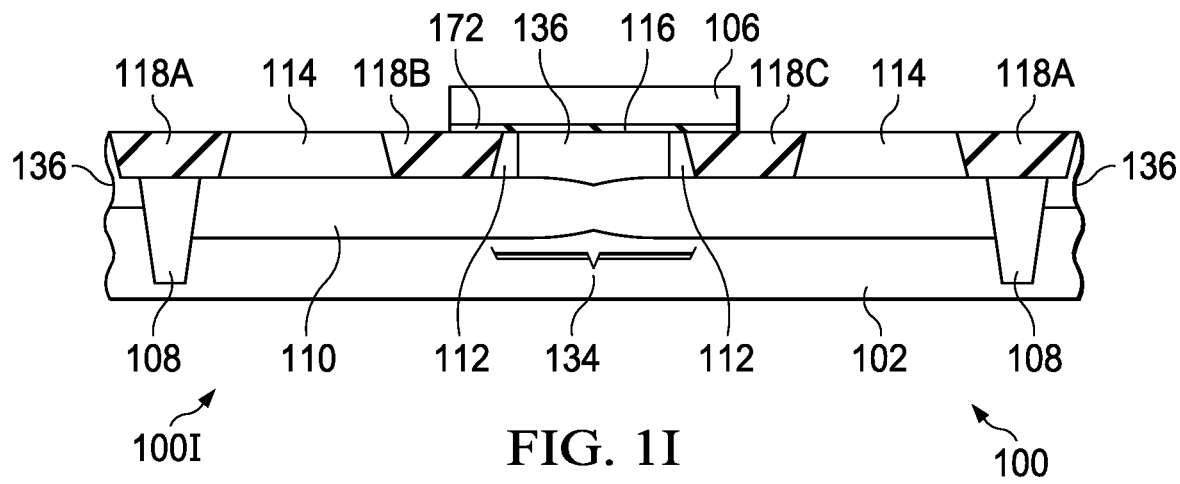

FIG. 1I depicts a ninth stage 100I of the MOS varactor 100 after the photoresist 176 and excess portions of the polysilicon layer 174 have been removed, leaving the polysilicon gate structure 106 as shown. The polysilicon gate structure 106 may be fabricated at the same time as the gates for complementary metal-oxide-semiconductor (CMOS) transistors on the wafer. The sidewall spacers that are generally formed on polysilicon gates may be used for the polysilicon gate structure 106, but are not necessary here because of the overlap of the polysilicon gate structure 106 with the STI structures 118. It can be noted that many new gate materials and gate dielectrics are being developed. Accordingly, although the present process is disclosed in using a polysilicon gate over a gate oxide layer, other materials, including metal gates—whether existing or future-developed—may be used for the gate and/or the gate dielectric layer while remaining within the disclosure.

Figure 1J:
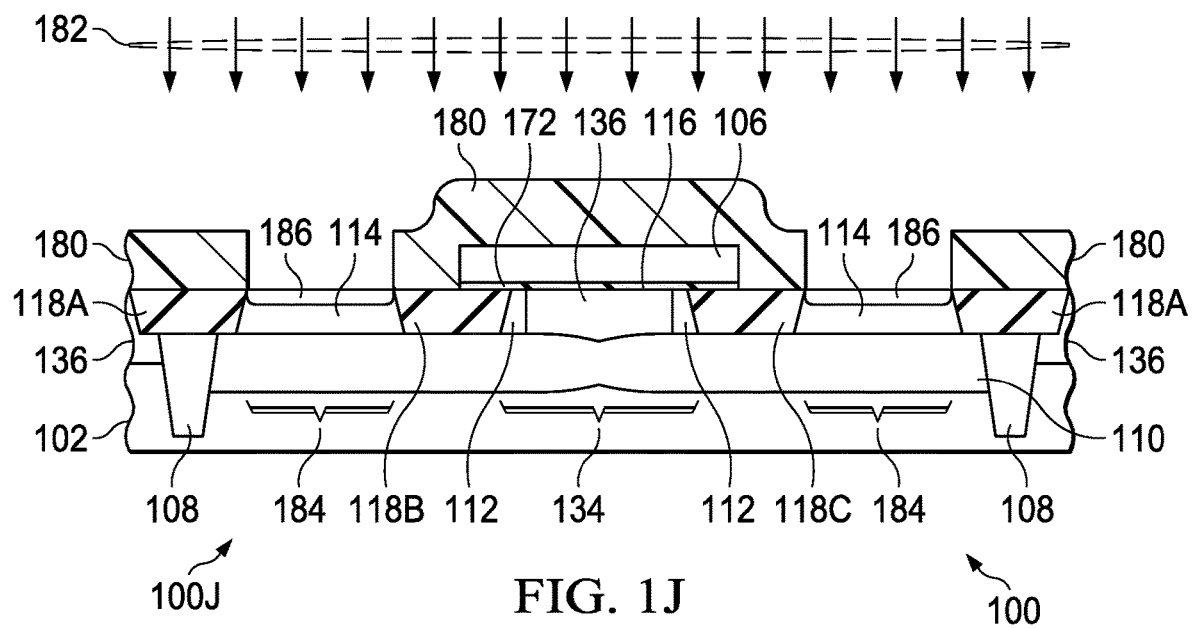

FIG. 1J depicts a tenth stage 100J of the MOS varactor 100 after a photoresist layer 180 is deposited and patterned and as an N+ source/drain implant 182 is being performed to implant dopants into bias terminals 184, forming doped regions 186. In implementations in which no buried layer is used, the N+ source/drain implant 182 may be used to form contacts to the N-type well 112; in the present implementation, the N+ source/drain implant will supplement the doping level of the N+ sinker regions 114. The N+ source/drain implant 182 is part of the doping process for CMOS transistors on the wafer. Although not explicitly shown, a P+ implant that is also part of the doping process for CMOS transistors can be used to form a P+ contact (not explicitly shown) outside of the deep trench structure 108 that enclose the MOS varactor 100 to form a low-resistance ground contact.

Figure 1K:
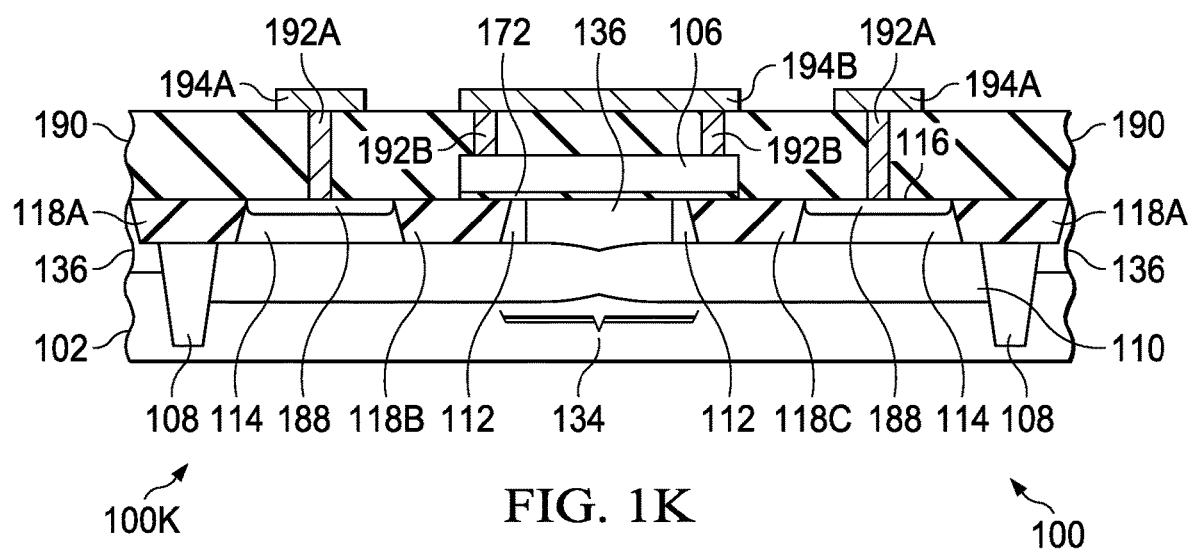

FIG. 1K depicts an eleventh stage 100K of the MOS varactor 100 after the photoresist 180 has been removed and the doped regions 186 have been diffused to form bias terminal contact regions 188. An inter-level dielectric 190 has been deposited over the upper surface 116. Vias 192 have been formed through the inter-level dielectric 190, with first vias 192A contacting the sinker regions 114 and second vias 192B contacting the polysilicon gate structure 106. Finally, a first metal layer 194 has been deposited and patterned to form first metal layer segments 194A and second metal layer segments 194B. The first metal layer segments 194A are coupled to the sinker regions 114 through the first vias 192A; likewise the second metal layer segment 194B is coupled to the polysilicon gate structure 106 through the second vias 192B.

While the above discussion has focused on a specific set of implants that are used in the BiCMOS technology and which may also be used in fabrication of the MOS varactor 100, other layers that are formed during processing of other devices on the substrate may also be used instead of or in addition to the disclosed layers that form the MOS varactor 100, a few of which are specifically mentioned here, but which one skilled in the design and fabrication of BiCMOS transistors will understand. In one example, a deep Well process that may be used to fabricate isolated NMOS transistors may also be implemented as part of the fabrication of the disclosed MOS varactor 100.

Figure 2:
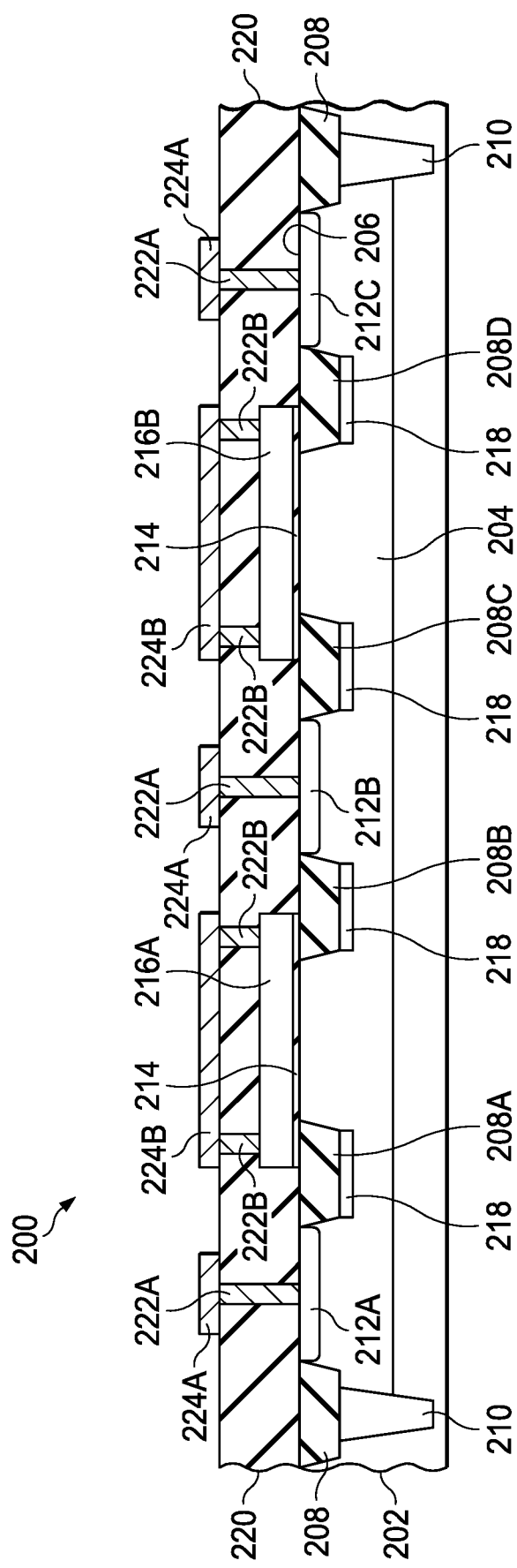
FIG. 2 depicts a cross-section of a varactor fabricated using a CMOS process flow according to an implementation of the disclosure.

FIG. 2 depicts a MOS varactor 200 that has been fabricated in a CMOS technology according to an implementation of the disclosure. In one implementation, the MOS varactor 200 is fabricated on a P-type substrate 202 that has an N-type well 204 formed at an upper surface 206 of the substrate. STI structures 208 have been formed across the N-type well 204, with deep trenches 210 formed at the edge of the N-type well 204. Three bias terminals 212 have also been formed within the N-type well 204. Two polysilicon gate structures 216 lie over gate dielectric layer 214 and over portions of N-type well 204; the lateral edges of each polysilicon gate structure 216 extend over a respective STI structure 208.

More specifically, a first portion of a first polysilicon gate structure 216A extends over a first side of a first STI structure 208A and a second portion of the first polysilicon gate structure 216A extends over a first side of a second STI structure 208B. Similarly, a first portion of a second polysilicon gate structure 216B extends over a first side of a third STI structure 208C and a second portion of the second polysilicon gate structure 216B extends over a first side of a fourth STI structure 208D. A first bias terminal 212A is formed on a second, opposite side of the first STI structure 208A, a second bias terminal 212B is formed between a second, opposite side of the second STI structure 208B and a second, opposite side of the third STI structure 208C, and a third bias terminal 212C is formed on a second, opposite side of the fourth STI structure 208D.

CMOS technology does not generally include a buried layer, although a buried layer may be added as an additional element. Alternatively, as shown in the MOS varactor 200, an N-type dopant has been implanted below each of the first STI structure 208A, the second STI structure 208B, the third STI structure 208C, and the fourth STI structure 208D to form respective doped link regions 218. In one implementation, dopants can be implanted in the doped link regions 218 during the formation of the formation of the STI structure 208, after the trenches have been etched and prior to deposition of the oxide filler. An inter-level dielectric 220 has been deposited over the upper surface 206 of the substrate 202 and over the polysilicon gate structures 216. A set of first vias 222A have been have been formed to contact each of the bias terminals 212 and a set of second vias 222B have been formed to contact each of the polysilicon gate structures 216. A first metal layer has been formed and patterned to form first metal segments 224A and second metal segments 224B. The first metal segments 224A are each electrically coupled to a respective bias terminal 212 through respective first vias 222A and the second metal segments 224B are each electrically coupled to a respective polysilicon gate structure 216 through respective second vias 222B.

Figure 2A:
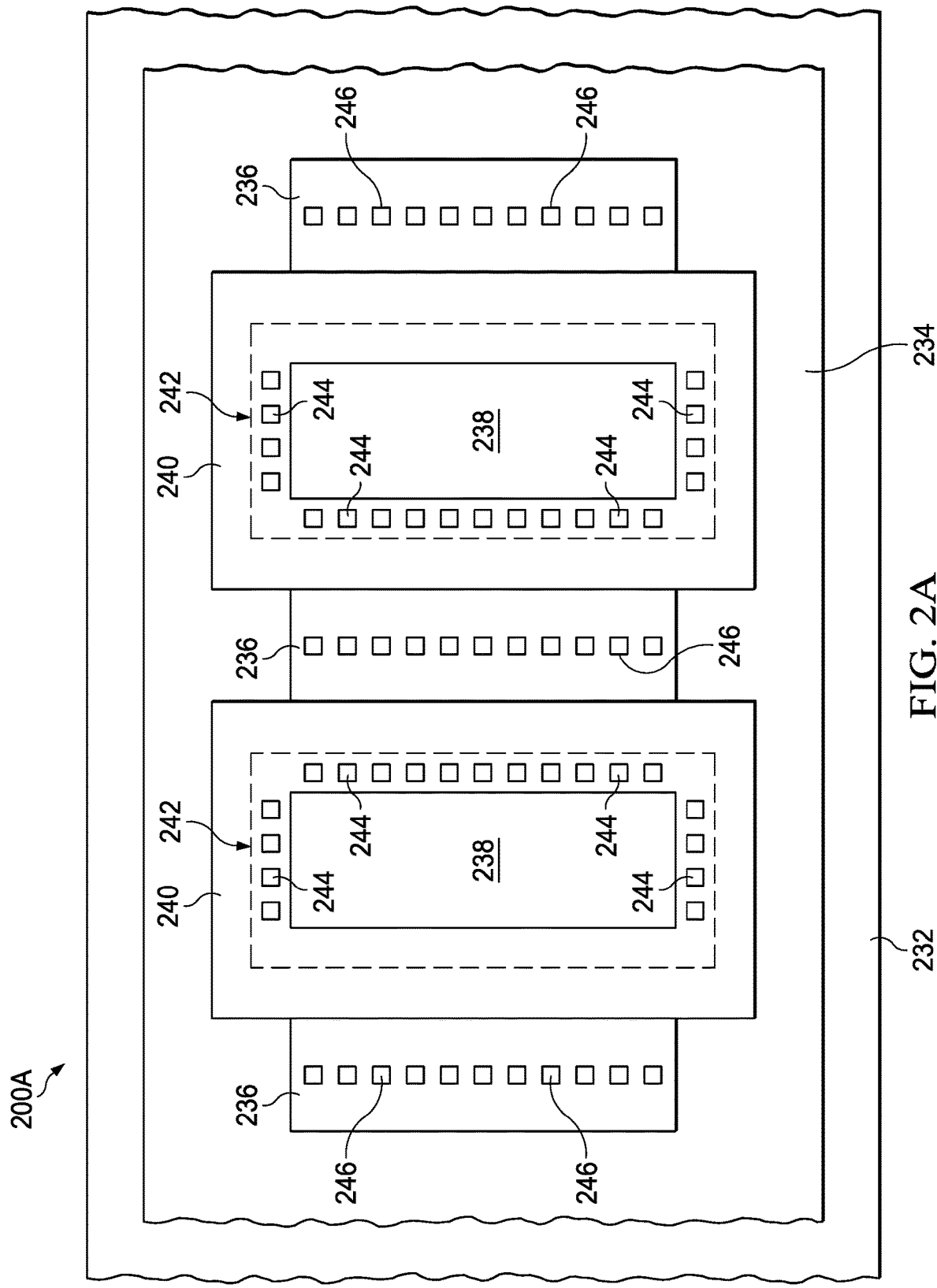
FIG. 2A depicts an overhead view of a MOS varactor according to an implementation of the disclosure.

FIG. 2A depicts an overhead view of a MOS varactor 200A according to an implementation of the disclosure. The view is primarily taken at the top of the silicon layer, although the location of the contacts and the gate are shown. A semiconductor substrate 232 includes an N-type well 234 and bias terminals 236. Channel regions 238 are surrounded on all four sides by STI structures 240. Differences in the doping within the channel region 238 are not shown in MOS varactor 200A, but may include the use of a well mask to modify the doping within the channel region 238. The location of the polysilicon gate structures 242 are shown by dotted lines; the polysilicon gate structures 242 lie over the respective channel regions 238 and extend over portions of the STI structures 240. The gate contacts 244 are placed within the portions of the polysilicon gate structures 242 that lie over the STI and in this implementation the gate contacts 244 are formed at both of the short sides of the gate (i.e., across the length), but are also formed on one long side of the gate (i.e., along the width). These additional gate contacts 244 may contribute to a reduction of the gate resistance. The bias terminal contacts 246 are placed, as before, along the width of the bias terminals 236.

Figure 3A:
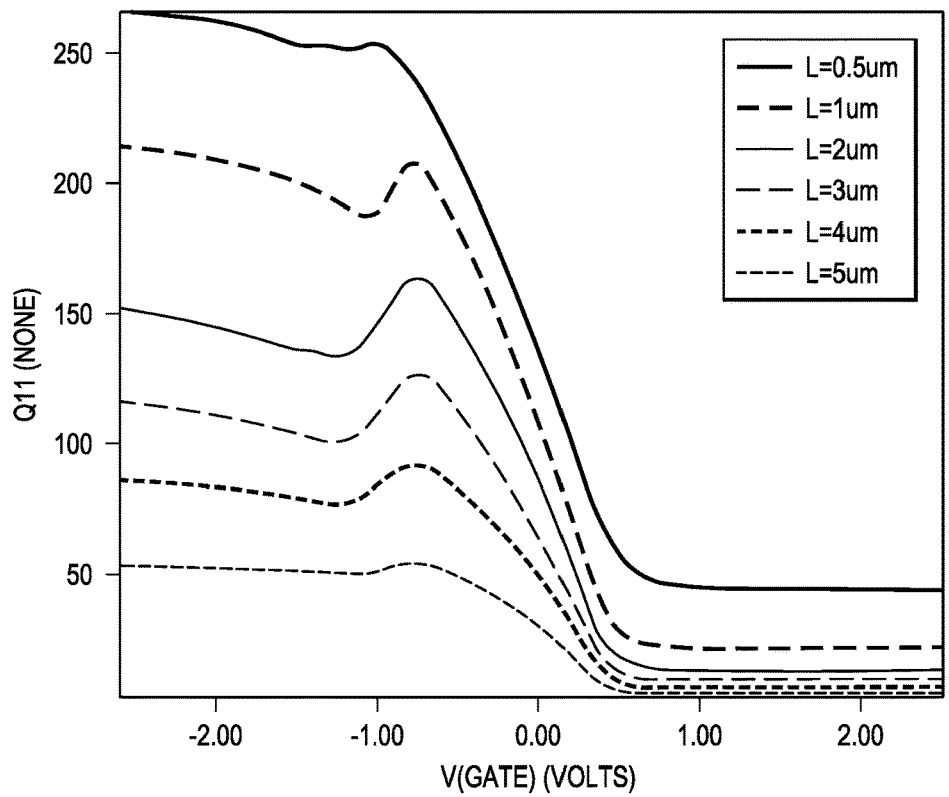
FIG. 3A shows a graph of a TCAD simulation of the Q versus the gate voltage on the MOS varactor of FIG. 1I for gates of various lengths according to an implementation of the disclosure.

FIG. 3A through FIG. 3D depict graphs and dopant concentration levels for a MOS varactor using the design shown and discussed with regard to FIG. 1. FIG. 3A depicts a graph 300A that plots simulations of the Q of respective MOS varactors against the voltage at the gate (with bias terminals grounded) as the voltage is varied from about −2.5 V to about 2.5 V. Each plot represents a gate having a different length and the series of plots demonstrates how the Q increases as the length of the gate is decreased from 5 µm to 0.5 µm. When the length of the gate is 5 µm, the maximum Q is just over 50; at 4 µm, the maximum Q is about 85; at 3 µm, the maximum Q is about 150; at 2 µm, the maximum Q has increased to about 170; at 1 µm, the maximum Q is about 210, while at a length of 0.5 µm, the Q has reached a maximum of about 270.

Figure 3B:
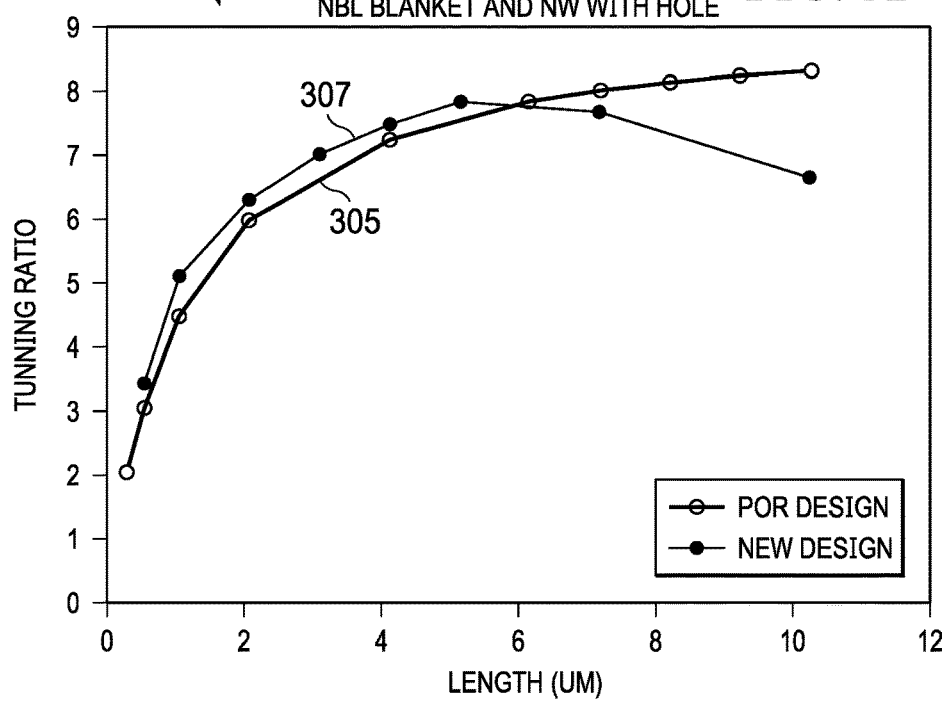
FIG. 3B depicts a graph of a TCAD simulation of the tuning ratio versus the gate length for a MOS varactor that contains a blanket NBL and an NWell that was implanted using a well mask.

FIG. 3B depicts a graph 300B that plots a simulation of the tuning ratio of the varactor against the gate length. Curve 305 represents a baseline varactor that does not implement the STI spacers, while curve 307 represents a varactor that uses a blanket NBL and an Well having a hole under the gate region. The implementation using the disclosed features initially has a greater tuning ratio, but reaches a maximum tuning ratio between about 5 µm and about 6 µm and falls. Further refinement of the design changes identified in the present application may be useful in extending the favorable tuning ratio.

Figure 3C:
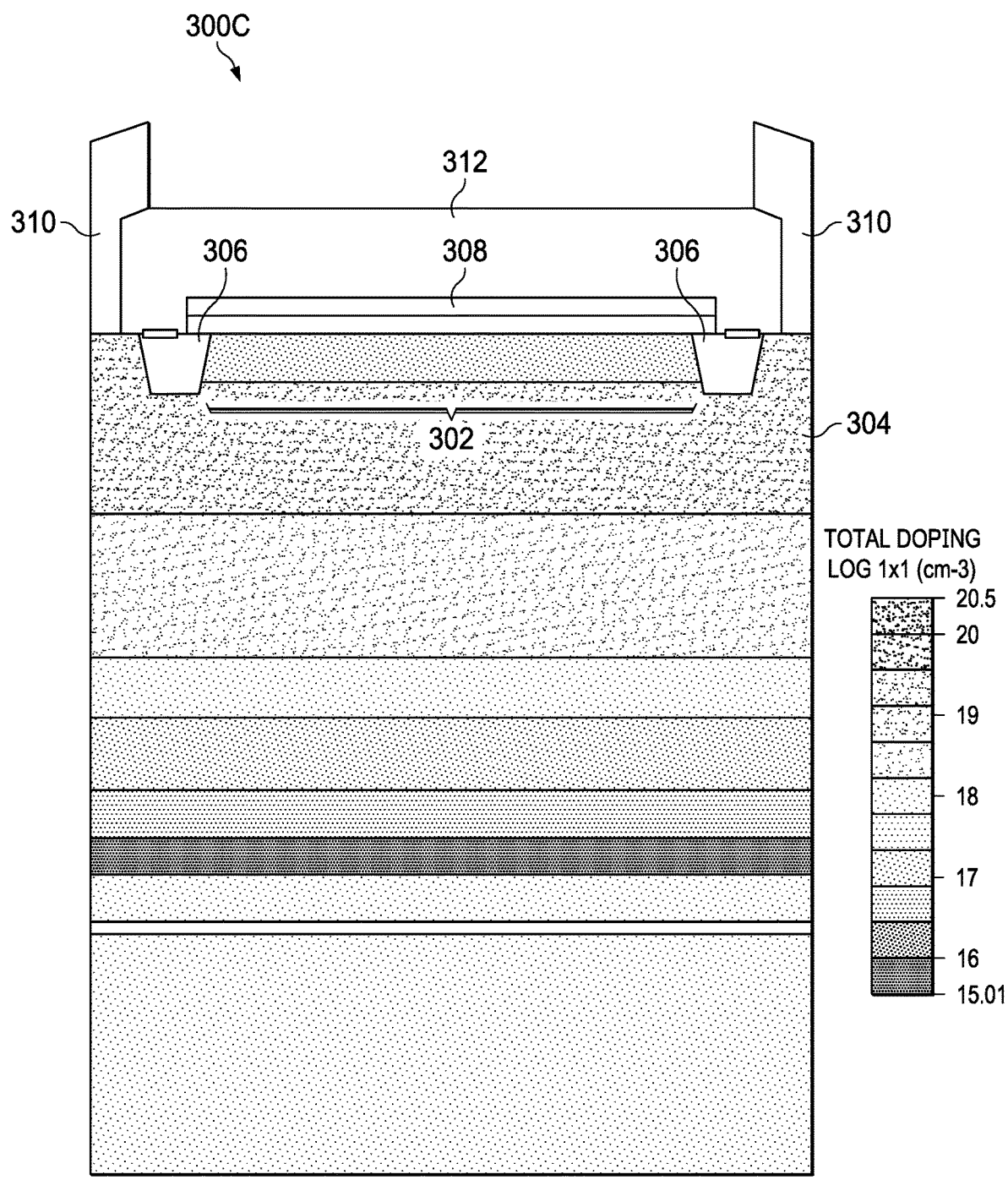
FIG. 3C shows the dopant concentration below the polysilicon gate structure of a MOS varactor that contains a blanket NBL and an NWell that was implanted using a well mask according to another implementation of the disclosure.

FIG. 3C depicts simulated doping concentrations in a gate region of a varactor 300C. The varactor 300C includes a channel region 302 that is separated from the bias terminals 304 by STI structures 306. Each end of a gate structure 308, which includes a polysilicon layer with silicide over a thin gate oxide (none of which are separately shown), lies over one of the STI structures 306. Also shown are the vias 310 to the bias terminals 304 and an inter-level dielectric 312. The simulation includes a blanket buried layer and a well that was implanted using the well mask 124 (FIG. 1) to reduce the doping level below the gate. The gate region has a reduced doping level, which is most evident near the STI structures 306, from which the doping concentration quickly drops, but below the channel region, the doping concentrations extend essentially uniformly across the gate region so that depletion will also be relatively even across the channel region 302 of the varactor.

Figure 3D:
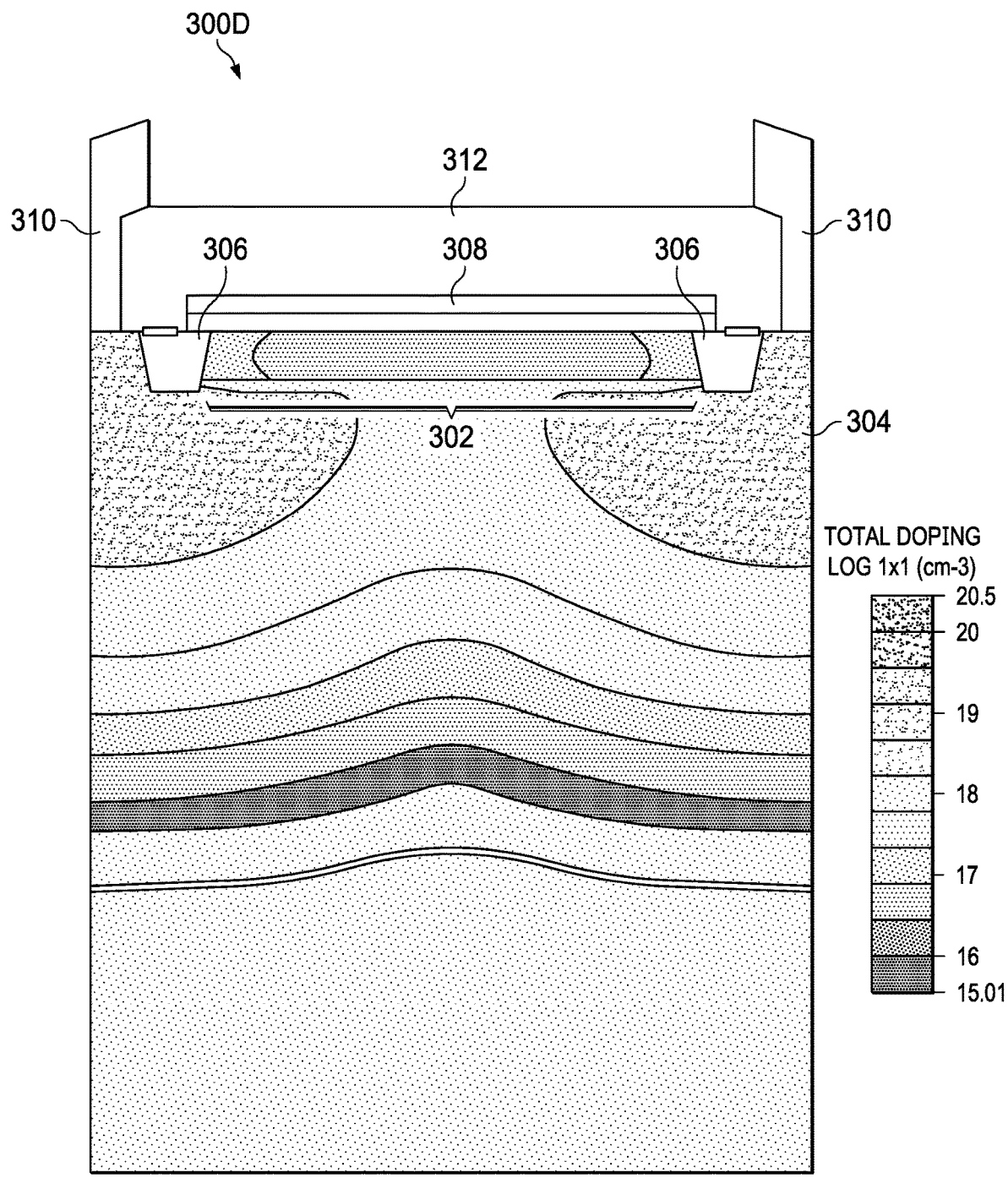
FIG. 3D shows the dopant concentration below the polysilicon gate structure of a MOS varactor containing both an NBL implanted using a BL mask and an NWell implanted using a well mask according to another implementation of the disclosure.

FIG. 3D depicts simulated doping concentrations in a gate region of a varactor 300D. The varactor 300D includes the use of both the well mask 124 (FIG. 1) and the BL mask 122 (FIG. 1), which were used to create a "hole" in the doping concentrations under the gate structure. Instead of having doping concentrations that extend relatively uniformly across the gate region, the channel region 302 of the varactor 300D has a more complex doping structure that is very lightly doped under the central region of the gate structure 308, but is somewhat heavier near the STI structures 306, as well as having lighter doping that extends downward from the channel region 302. This doping can assist in providing a lower off-state capacitance when there is a large bias present, while providing a low resistance in the pocket. Maintaining a greater doping level near the STI structures 306 may shield any trapped charge present in the STI structures 306 from the device.

Figure 4:
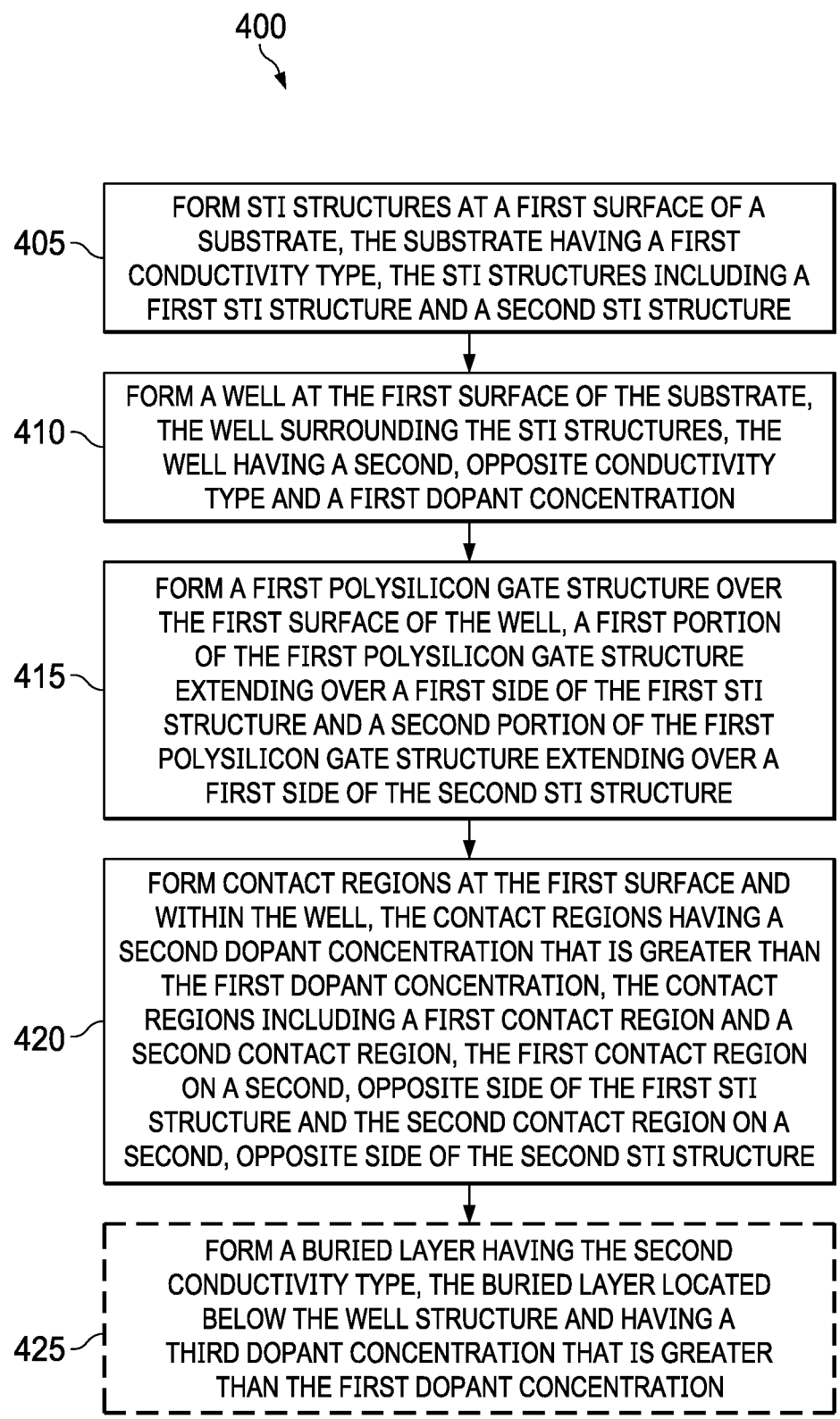
FIG. 4 depicts a method of fabricating a MOS varactor according to an implementation of the disclosure.

FIG. 4 depicts a method 400 of fabricating an integrated circuit that includes a MOS varactor. The method 400 includes forming 405 STI structures at a first surface of a substrate. The substrate has a first conductivity type and the STI structures include a first STI structure and a second STI structure. In the implementation of FIG. 1, the first STI structure may be the STI structure 118B and the second STI structure may be the STI structure 118C, while in the implementation of FIG. 2, the first STI structure may be the STI structure 208A and the second STI structure may be the STI structure 208B. In one implementation, the first conductivity type is P-type. The STI structures can also include a third STI structure and a fourth STI structure and may include a large number of STI structures. In the implementation of FIG. 2, the third STI structure may be the STI structure 208C and the fourth STI structure may be the STI structure 208D.

The method 400 also includes forming 410 a well at the first surface of the substrate. The well surrounds the STI structures and has a second, opposite conductivity type and a first dopant concentration. When the first conductivity type is P-type, the second conductivity type is N-type. As has been disclosed, a well mask may be used during fabrication of the well. The well mask may block out a region in planned channel regions so that the dopant concentration is not even across the well.

The method 400 forms 415 a first polysilicon gate structure over the first surface of the well. A first portion of the first polysilicon gate structure extends over a first side of the first STI structure and a second portion of the first polysilicon gate structure extends over a first side of the second STI structure, so that first and second portions of the first polysilicon gate structure do not contact the underlying silicon, reducing the parasitic capacitance at the edges of the first polysilicon gate structure. Where additional STI structures have been formed, e.g., a third STI structure and a fourth STI structure, a second polysilicon gate structure is formed over the first surface of the well. A first portion of the second polysilicon gate structure extends over a first side of the third STI structure and a second portion of the second polysilicon gate structure extends over a first side of the fourth STI structure. Although the polysilicon gate structures have typically been doped with the same conductivity type as the well and contact regions, having the two sides of the polysilicon gate structure terminate over the STI structures provides the capability to dope the polysilicon gate structure with either an N+ polysilicon or a P+ polysilicon, regardless of the conductivity type of the rest of the MOS varactor.

Another element of the method 400 is forming 420 contact regions at the first surface and within the well. The contact regions have a second dopant concentration that is greater than the first dopant concentration and include a first contact region and a second contact region. The first contact region is on a second, opposite side of the first STI structure and the second contact region on a second, opposite side of the second STI structure.

Although not required, the method 400 may form 425 a buried layer having the second conductivity type. The buried layer, if present, is located below the well structure and has a third concentration that is greater than the first concentration. Although mentioned last in the method, the buried layer may be formed prior to the formation of other elements of the integrated circuit. When the buried layer is provided, the contact regions may be formed as sinker regions that extend from the first surface to the buried layer. Fabrication of the buried layer may include using a BL mask, which may block out portions of the buried layer implant over regions of planned channel regions in order to shape the doping levels under these channel regions.

Applicants have disclosed an integrated circuit, which includes a MOS varactor, and a method of fabricating an integrated circuit that includes a MOS varactor. Aspects of the disclosed devices and methods include using STI isolation to separate the channel region from the bias terminals and placing the polysilicon gate so that opposite sides of the polysilicon gate terminate over respective STI regions to decrease parasitic capacitance. A buried layer can be added to decrease resistance in the substrate, with sinker regions coupling the buried layer to a first surface of the IC. Both the well region and the buried layer may be fabricated using a well mask and a BL mask respectively to block dopants from regions formed in and under the channel region. The resulting doping of the MOS varactor may reduce resistance of the substrate and/or the size of the bias depletion region, which may be used to adjust the tuning ratio and the Q of the MOS varactor. These changes may provide the ability to shrink the MOS varactor cell size at a fixed capacitance and Q target relative to currently known MOS varactors. These capabilities leverage existing layers in BiCMOS process platforms and can be applied to other technologies, e.g., CMOS processing, with appropriate adjustments. The proposed structures provide device and design engineers tools that may be used to better optimize and/or adjust the MOS varactor. The disclosed layouts may be easily modified to balance tuning of the $C_{on}/C_{off}$ ratio versus Q enhancement. The disclosed method may also provide better scaling of the width of the elements used for RF simulations as opposed to their implementation in silicon, which may reduce current crowding at high frequencies.

Although various examples have been shown and described in detail, the claims are not limited to any particular example or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described examples that are known to those of ordinary skill in the art are expressly incorporated herein by reference and are intended to be encompassed by the present claims. Accordingly, those skilled in the art will recognize that the exemplary examples described herein can be practiced with various modifications and alterations within the spirit and scope of the claims appended below.

What is claimed is:

1. A method of fabricating an integrated circuit comprising:
    forming shallow trench isolation (STI) structures at a surface of a substrate, the substrate having a first conductivity type, the STI structures including a first STI structure and a second STI structure;
    forming a well at the substrate surface, the well surrounding the STI structures, the well having an opposite second conductivity type and a first dopant concentration;
    forming a first polysilicon gate structure over the well, a first portion of the first polysilicon gate structure extending over a first side of the first STI structure and a second portion of the first polysilicon gate structure extending over a first side of the second STI structure; and
    forming contact regions at the substrate surface and within the well, the contact regions having a second dopant concentration that is greater than the first dopant concentration, the contact regions including a first contact region and a second contact region, the first contact region on an opposite second side of the first STI structure and the second contact region on an opposite second side of the second STI structure.

2. The method as recited in claim 1 in which the first conductivity type is P and the second conductivity type is N.

3. The method as recited in claim 1 further comprising:
    forming a third STI structure and a fourth STI structure;
    forming a second polysilicon gate structure over the substrate surface, a first portion of the second polysilicon gate structure extending over a first side of the third STI structure and a second portion of the second polysilicon gate structure extending over a first side of the fourth STI structure; and forming a third contact region, the first contact region between first STI structure and the third STI structure.

4. The method as recited in claim 1 including forming a buried layer having the second conductivity type and a third dopant concentration that is greater than the first dopant concentration, the buried layer located below the well.

5. The method as recited in claim 4 in which a first sinker region extends from the first contact region to the buried layer and a second sinker region extends from the second contact region to the buried layer.

6. The method as recited in claim 1 including forming a first doped link region under the first STI structure and a second doped link region under the second STI structure.

7. The method as recited in claim 1 including forming a deep trench structure surrounding the well, the first polysilicon gate structure, and the contact regions.

8. The method as recited in claim 7 in which forming the deep trench structure includes implanting a dopant having the first conductivity type below the deep trench structure, the method including forming a substrate contact region having the first conductivity type outside of the deep trench structure.

9. The method as recited in claim 1, further comprising forming a polysilicon gate structure overlying a gate dielectric extending between the first and second STI structures, the well touching the gate dielectric continuously between the first and second STI structures.

10. The method as recited in claim 1, wherein the first and second STI structures are first and second locations of a enclosing STI structure that forms a closed loop around a channel region underlying the first polysilicon gate structure.

11. The method as recited in claim 1, wherein the first polysilicon gate structure is an electrode of a varactor.

12. An integrated circuit comprising:
a substrate having a first conductivity type, the substrate having an upper surface;
a well formed at the upper surface, the well having a second conductivity type that is opposite the first conductivity type, the well having a first dopant concentration;
a first shallow trench isolation (STI) structure formed at the upper surface and within the well;
a second STI structure formed at the upper surface and within the well;
a first polysilicon gate structure formed over the upper surface between the first STI structure and the second STI structure, a first portion of the first polysilicon gate structure extending over a first side of the first STI structure and a second portion of the first polysilicon gate structure extending over a first side of the second STI structure;

a first doped region formed within the well at the upper surface and on a second side of the first STI structure; and
a second doped region formed within the well at the upper surface and on a second side of the second STI structure, the first and second doped regions each having the second conductivity type and a second dopant concentration that is greater than the first dopant concentration.

13. The integrated circuit as recited in claim 12 including:
a third structure STI that is formed within the well at the upper surface, the first doped region extending between the first STI structure and the third STI structure;
a fourth STI structure that is formed within the well at the upper surface, the second doped region extending between the second STI and the fourth STI; and
a second polysilicon gate structure formed over the upper surface between the third STI structure and the fourth STI structure, a first portion of the second polysilicon gate structure extending over a first side of the third STI structure and a second portion of the second polysilicon gate structure extending over a first side of the fourth STI structure.

14. The integrated circuit as recited in claim 13 including a buried layer formed in the substrate, the buried layer having the second conductivity type, the well extending to the buried layer.

15. The integrated circuit as recited in claim 14 in which the first doped region and the second doped region form sinker regions that extend from the upper surface to the buried layer.

16. The integrated circuit as recited in claim 15 in which the buried layer has a reduced dopant concentration under the first polysilicon gate structure and the second polysilicon gate structure.

17. The integrated circuit as recited in claim 15 in which the well has a reduced dopant concentration under the first polysilicon gate structure and the second polysilicon gate structure.

18. The integrated circuit as recited in claim 14 including a deep trench structure extending from the upper surface through the buried layer to the substrate and surrounding the well.

19. The integrated circuit as recited in claim 12 in which the first conductivity type is P and the second conductivity type is N.

20. The integrated circuit as recited in claim 12 in which the first polysilicon gate structure is doped with the second conductivity type.

21. The integrated circuit as recited in claim 12 in which the first polysilicon gate structure is doped with the first conductivity type.

22. The integrated circuit as recited in claim 12 wherein the first polysilicon gate structure is an electrode of a varactor.

* * * * *